US009813060B2

(12) United States Patent
Ehrensperger et al.

(10) Patent No.: US 9,813,060 B2
(45) Date of Patent: Nov. 7, 2017

(54) ACTUATOR AND METHOD OF MANUFACTURE THEREOF

(75) Inventors: Marie-Virginie Ehrensperger, Aubervilliers (FR); Paul-Henri Guering, Aubervilliers (FR); Philippe Laval, Aubervilliers (FR); Richard Morlat, Vaujours (FR); Jean-Louis Mongrolle, Chambery (FR); Yves Benkemoun, Suresnes (FR); Christelle Pousse, Vaujours (FR)

(73) Assignee: Saint-Gobain Placo SAS, Suresnes (FR)

( * ) Notice: Subject to any disclaimer, the term of this patent is extended or adjusted under 35 U.S.C. 154(b) by 1176 days.

(21) Appl. No.: 13/988,694

(22) PCT Filed: Nov. 22, 2011

(86) PCT No.: PCT/GB2011/052288
§ 371 (c)(1),
(2), (4) Date: May 21, 2013

(87) PCT Pub. No.: WO2012/069818
PCT Pub. Date: May 31, 2012

(65) Prior Publication Data
US 2013/0241629 A1 Sep. 19, 2013

(30) Foreign Application Priority Data
Nov. 22, 2010 (GB) .................................. 1019767.1

(51) Int. Cl.
*B06B 1/06* (2006.01)
*H03K 17/96* (2006.01)
(Continued)

(52) U.S. Cl.
CPC ........... *H03K 17/964* (2013.01); *E04C 2/043* (2013.01); *G06F 3/043* (2013.01); *H01H 11/00* (2013.01);
(Continued)

(58) Field of Classification Search
CPC ...... E04C 2/043; H03K 17/96; H03K 17/964; H03K 2217/96003; H03K 2217/96015; H01H 11/00; Y10T 29/49105
(Continued)

(56) References Cited

U.S. PATENT DOCUMENTS 7,511,711 B2  3/2009  Ing et al.
2003/0066692 A1  4/2003  Devige et al.
(Continued)

FOREIGN PATENT DOCUMENTS

CN  101242176 A  8/2008
EP  2116921 A  11/2009
(Continued)

OTHER PUBLICATIONS

PCT International Search Report for PCT/GB2011/052288 dated Mar. 23, 2012.

*Primary Examiner* — Mark Hellner
(74) *Attorney, Agent, or Firm* — GrayRobinson, P.A.; Christopher M. Ramsey; Michael J. Colitz, III

(57) ABSTRACT

An actuator for controlling the operation of an apparatus comprises a panel (16) and an acoustic sensor (26). The panel provides a partition within a building structure, while the acoustic sensor is adapted to detect acoustic waves propagating through the panel. When a user exerts pressure against the panel, the sensor detects the acoustic waves that are formed and emits signals for controlling the operation of
(Continued)

an apparatus, such as a doorbell, a light source, a television, a sound system, a ventilation system, a window blind, a radio or an alarm.

24 Claims, 5 Drawing Sheets

(51) Int. Cl.
*E04C 2/04* (2006.01)
*H01H 11/00* (2006.01)
*G06F 3/043* (2006.01)

(52) U.S. Cl.
CPC ... *H03K 17/96* (2013.01); *H03K 2217/96003* (2013.01); *H03K 2217/96015* (2013.01); *Y10T 29/49105* (2015.01)

(58) Field of Classification Search
USPC .......................................................... 367/140
See application file for complete search history.

(56) References Cited

U.S. PATENT DOCUMENTS

| | | |
|---|---|---|
| 2003/0150190 A1 | 8/2003 | Schroth |
| 2005/0146513 A1 | 7/2005 | Hill et al. |
| 2005/0174338 A1 | 8/2005 | Ing et al. |
| 2006/0147051 A1* | 7/2006 | Smith .................. G10K 11/172 381/71.2 |
| 2009/0283292 A1* | 11/2009 | Lehr ........................ H02G 3/14 174/67 |
| 2010/0283745 A1 | 11/2010 | Nikolovski et al. |
| 2011/0261655 A1* | 10/2011 | Aklil ..................... G01N 29/50 367/125 |

FOREIGN PATENT DOCUMENTS

| | | |
|---|---|---|
| WO | 2006040193 A | 4/2006 |
| WO | 2009047768 A | 4/2009 |

* cited by examiner

ACTUATOR AND METHOD OF MANUFACTURE THEREOF

CLAIM OF PRIORITY

This application is a continuation of and claims priority under 35 U.S.C. §371 to International Application No. PCT/GB2011/052288 filed on Nov. 22, 2011, which in turn claims priority to GB 1019767.1 filed on Nov. 22, 2010. The contents of both these applications are incorporated herein by reference for all purposes.

The present invention relates to actuators for use within building structures, in particular, actuators that are activated by the formation of acoustic waves. The present invention further relates to the manufacture of such actuators.

Building structures typically contain many actuators e.g. light switches for actuating electric lights and other buttons for activating e.g. doorbells, alarm systems, and heating systems. It is also known to use remote-control devices to operate e.g. televisions, sound systems, or window blinds. In all of these cases, the actuator is typically a button that is pressed to create mechanical and electrical contact between two conducting elements, so as to complete an electrical circuit and provide a signal to activate the apparatus of interest.

At its most general, the present invention may provide an actuator that is triggered by means of the formation of acoustic waves in a partition wall within a building structure.

Therefore, in a first aspect, the present invention may provide an actuator for controlling the operation of an apparatus, the actuator comprising:
(i) a panel for providing a partition within a building structure; and (ii) at least one acoustic sensor for detecting acoustic waves propagating through the panel, the acoustic sensor being adapted to emit signals for controlling the operation of the apparatus.

The apparatus may be e.g. a doorbell, a light source, a television, a sound system, a ventilation systems, window blinds, a radio, or an alarm. Typically, the sensor is a piezoelectric transducer.

Typically, a user will touch or press a section of the surface of the panel, so as to induce acoustic waves in the panel. These waves are detected by the acoustic sensor and cause it to emit signals that are used to control the operation of the apparatus. Thus, the user is not limited to pressing a button at a specific location of the panel, but may instead touch or press any one of a number of sections of the panel, in order to activate the actuator. Thus, there may be no need to provide discrete buttons on the surface of the partition. In this way, a partition may be provided that has a clear and uncluttered surface, allowing e.g. furniture to be placed against the partition, without the requirement to avoid obscuring buttons and switches that protrude from the partition. Optionally, however, the panel of the actuator includes a marker to indicate at least one zone of the panel against which the user may exert pressure in order to activate the actuator.

Furthermore, the actuator according to the first aspect of the invention may avoid the need to provide holes in a partition, to accommodate conventional electric switches. Additionally, exposure of electric wiring to damp environments, e.g. bathrooms, may be avoided. In general, the actuator may be activated by users of different heights, in contrast to discrete buttons and switches, which require the user to be of a predetermined minimum height.

Effectively, therefore, the first aspect of the invention may provide a touch sensitive panel, the panel providing a partition within a building structure.

The actuator may be activated by pressure from the user's finger or from another object. The actuator is generally configured to detect pressure applied into the face of the board. Typically in such cases, the actuator is used to change an apparatus from one discrete state to another, e.g. to switch the apparatus on and off.

However, the actuator may additionally or alternatively be configured to detect a sliding action on the surface of the panel. This configuration may be applied e.g. when the actuator is used to provide continuous variation in the mode of operation of the apparatus, e.g. the actuator may be used to control the volume of a radio or television, or to control the intensity of a light source.

Preferably, the actuator includes at least two of the acoustic sensors.

In one embodiment, the actuator includes two acoustic sensors that are positioned near one and the same edge of the panel.

In certain cases, the actuator may include at least four of the acoustic sensors. In the case that the actuator includes a plurality of acoustic sensors, the active areas of the panel (that is, the areas that must be pressed in order to trigger the actuator) are determined by the location of the acoustic sensors.

Typically, the panel may be a gypsum wallboard. In general, such wallboards comprise a gypsum core and a lining sheet bounding the gypsum core. The lining sheet is typically paper.

Preferably, the acoustic sensor is located within the panel. More preferably, the acoustic sensor is positioned such that it does not protrude from the surface of the panel. In this way, the panel may present a flat surface, e.g. that may easily be covered with e.g. wallpaper or another wall covering. Additionally, by positioning the acoustic sensor such that it does not protrude from the surface of the panel, it may be possible to supply the panels having a pre-installed sensor, the positioning of the sensor allowing the panels to be easily stacked and transported.

The panel may have a recessed portion for accommodating the sensor. As an alternative, the sensor may be entirely contained within the panel.

In cases where the sensor is not located within the panel, the sensor may be e.g. glued or taped to the panel using adhesive tape. In certain cases, the sensor may be attached to a metal scaffold that supports the panel.

The actuator is typically connected to a controller, the controller being for receiving signals from the sensor and communicating with the apparatus. The controller may be e.g. a control system comprising an electronic chip, the electronic chip having an algorithm for analysing the signals received by the control system from the sensor or sensors.

The controller may be configured to communicate with the apparatus by means of electromagnetic waves. In this way, the actuator may communicate with the apparatus without the need for electrically-conductive wiring. In this case, the electromagnetic waves are typically of radio frequency. The controller may be configured to communicate with the apparatus by means of e.g. WiFi technology.

Electrical contact between the sensor and the controller may be provided by electrically-conductive materials, e.g. by screen-printed wiring.

In the case that the actuator includes a plurality of sensors, the controller may be configured to determine to which section of the panel pressure has been applied. For example, the controller may be calibrated to recognise one or more "active zones" on the panel. These are the regions of the panel against which the user may exert pressure to activate the actuator. The location of the "active zones" may be varied by re-calibrating the controller. For example, the controller may be re-calibrated such that it responds to signals from a newly-defined sub-set of sensors, selected from the plurality of sensors included in the actuator. Re-calibration of the controller may be carried out by the installer or the user of the panel.

The actuator may comprise buttons or markers to identify the location of each active zone.

The controller may be capable of communicating with more than one apparatus, such that the actuator may be used to control the operation of more than one apparatus. In this case, the actuator may be configured to have multiple "active zones", each "active zone" being for actuation of a respective apparatus.

The determination of the location of the region of contact between the actuator and the user may be effected e.g. by measuring the difference in the time of arrival of acoustic waves at the positions of the different sensors. This method requires the actuator to have at least four sensors, and is described e.g. in FR2811107.

As an alternative, the controller may determine the location of the impact received by the actuator through analysis of the acoustic signature that is generated. That is, the acoustic signature that is generated when the board receives an impact is detected and compared to a pre-determined acoustic signature. This method is known as the Reversys™ system, supplied by Sensitive Object, and is described e.g. in EP1512116. This method requires the actuator to have at least two sensors. That is, in certain embodiments, only two sensors are required.

Surprisingly, it has been found that the Reversys™ technology may be used with gypsum wallboard, even if the wallboard is not acoustically isolated. Furthermore, the Reversys™ technology allows sensors to be positioned at any location on the panel. In particular, sensors may be positioned near the edges of the panel, in particular near one and the same edge of the panel, allowing for easy access to the sensors when maintenance operations are required. In one embodiment, the Reversys™ technology is used in conjunction with two acoustic sensors that are positioned near one and the same edge of the panel.

Surprisingly, it has been found that Reversys™ technology may be used with the invention, even when the two acoustic sensors are positioned symmetrically, e.g. with respect to a longitudinal symmetry axis of the panel. In particular, it has been found that, for the application of the Reversys™ technology to an actuator for controlling the operation of an apparatus within a building structure, it is not required to discriminate between active zones of the panel to such a high level as for, e.g. tactile screens. Thus, the sensors emitting the signals can also be positioned symmetrically with respect to the panel, which arrangement may be advantageous in that it makes the manufacturing, installation and maintenance of the actuator easier.

Typically, the actuator further comprises a power source, for supplying power to e.g. the controller. The power source may be e.g. a photovoltaic power source. The panel may have a further recessed portion for accommodating the power source.

In certain cases, the controller may be configured such that the power required for its operation is provided by mechanical vibrations induced in the panel e.g. by a user exerting pressure on the panel.

In certain cases, the actuator may be configured such that it includes an antenna for receiving electromagnetic radiation, and converting the radiation into electric current to power the controller. Thus, there may be no need for wiring to connect a power source to the controller.

In certain embodiments, the actuator may include an electrically-conductive plate (e.g. a metallic plate) contained within the panel. Typically, the electrically-conductive plate is in electrical contact with the sensor. The electrically-conductive plate may allow electrical contact to be established more easily between the sensor and a controller. That is, the electrically-conductive plate may provide a surface for electrical contact with conductive elements inserted through a face of the panel. In this way, the panel may be supplied without any protruding wires for connecting the sensor(s) to the controller, since the person installing the actuator need only pierce the panel, to create electrical contact between the controller and the electrically-conductive plate, and hence between the controller and the sensor.

It is preferred to supply the actuator for installation in a building structure in a form such that the sensor is already attached to the panel. Therefore, in a second aspect, the present invention may provide a method of manufacture of an actuator according to the first aspect of the invention, comprising the steps of:
providing a calcium sulphate slurry;
allowing the slurry to set to provide a gypsum panel; and
inserting an acoustic sensor in the calcium sulphate slurry before it has completely set.

Thus, the method of manufacture according to the second aspect of the invention may provide an actuator in which the acoustic sensor is buried within the panel. In this way, the sensor is supplied with the panel and there is no need for later installation of the sensor on the panel. Thus, the method of manufacture helps to avoid variations in quality that may be associated with subsequent installation of the sensor on the panel. Typically, the sensor is a piezoelectric transducer.

The method of manufacture according to the second aspect of the invention may include the further step of inserting an electrically-conductive plate (e.g. a metallic plate) in the calcium sulphate slurry before it has completely set. Preferably, the electrically-conductive plate is electrically connected to the sensor by e.g. a wire. This may allow a panel to be supplied that can be easily connected to e.g. a controller, as the person installing the actuator need only pierce the surface of the panel in order to create an electrical connection between the controller and the electrically-conductive plate. Furthermore, the actuator may be supplied without any protruding wires.

The method of manufacture according to the second aspect of the invention may be used more generally for providing a gypsum wallboard having a sensor buried within it.

In certain cases, the actuator of the first aspect of the invention may comprise a panel having a liner at its surface, the liner being e.g. a paper sheet. For example, in the case that the panel is a gypsum wallboard, the panel will generally comprise a gypsum core that is bounded by a liner.

In such cases, it may be advantageous to provide a panel in which the sensor is located beneath the liner. Therefore, in a third aspect, the present invention may provide a method of manufacture of an actuator according to the first aspect of the invention, comprising the steps of:
attaching an acoustic sensor to a sheet; and
forming a panel having the sheet as a liner, the sensor being located on an inwardly-facing surface of the sheet.

Thus, the method of manufacture of the third aspect of the invention may provide an actuator in which the sensor is attached to the panel, such that there is no need for later installation of the sensor onto the panel.

Typically, the panel is a gypsum wallboard. In this case, the step of forming the panel comprises the step of depositing a gypsum slurry on the surface of the sheet to which the acoustic sensor is attached. When the slurry has set, a gypsum wallboard is provided having an acoustic sensor located between the lining sheet and the gypsum core.

In general, the sheet comprises paper.

Preferably the method according the third aspect of the invention includes the further step, before the step of attaching a sensor to the sheet, of providing electrically-conductive paths in the sheet. Typically, this may be done by screen printing. By attaching the sensor to the sheet such that it is electrically connected to the conductive paths, it may be possible to avoid the requirement for additional wiring to connect the sensor to a controller for controlling operation of an apparatus.

Typically, the step of attaching the sensor to the sheet is carried out using adhesive tape or glue. Typically, the sensor is a piezoelectric transducer.

The method of manufacture according to the third aspect of the invention may be used more generally to provide a panel having one or more attached sensors.

In a fourth aspect, the present invention may provide a building structure comprising a wall and a floor, the wall comprising an actuator according to the first aspect of the invention, a power source, the power source being located within the wall. That is, the wall may comprise the actuator panel and a further panel, the power source being located between the actuator panel and the further panel.

Preferably, the wall further comprises a removable access board, the power source being accessible from the outer surface of the wall via the access board. Preferably, the access board is located adjacent to the floor. Preferably, the sensor is located on the portion of the panel proximate to the floor and is accessible from the outer surface of the wall via the removable access board.

In certain embodiments of the fourth aspect of the invention, the power source may be a photovoltaic power source. In such cases, the access board is generally translucent or transparent.

The building structure according to the fourth aspect of the invention may include optional features of the actuator according to the first aspect of the invention.

In a fifth aspect, the present invention may provide a method of manufacture of an actuator according to the first aspect of the invention, comprising the steps of:
providing a panel;
providing at least one recess in at least one face of the panel; and
positioning an acoustic sensor in the at least one recess.

Typically, the depth of the at least one recess is greater than or equal to one dimension of the sensor. That is, preferably, the method allows the sensor to be positioned in the recess such that the sensor does not protrude from the face of the panel. For example, the sensor may be positioned such that its outwardly-facing surface is flush with the face of the panel.

The sensor may be secured within the recess e.g. by gluing.

Typically, the panel is a gypsum wallboard. In this case, the step of providing at least one recess in at least one face of the panel may be carried out before the gypsum slurry has entirely set. Alternatively, the recess may be provided after the slurry has set.

Typically, a plurality of recesses are provided in the panel. The number of recesses may be greater than the number of sensors intended for use in the actuator. This may allow the location of one or more sensors to be changed, according to the requirements of the installer or user of the actuator.

The invention will now be described by way of example, with reference to the following Figures:

FIG. 1 shows a section view of a building structure according to an embodiment of the fourth aspect of the invention. The building structure includes an actuator according to an embodiment of the first aspect of the invention.

Figure 1:
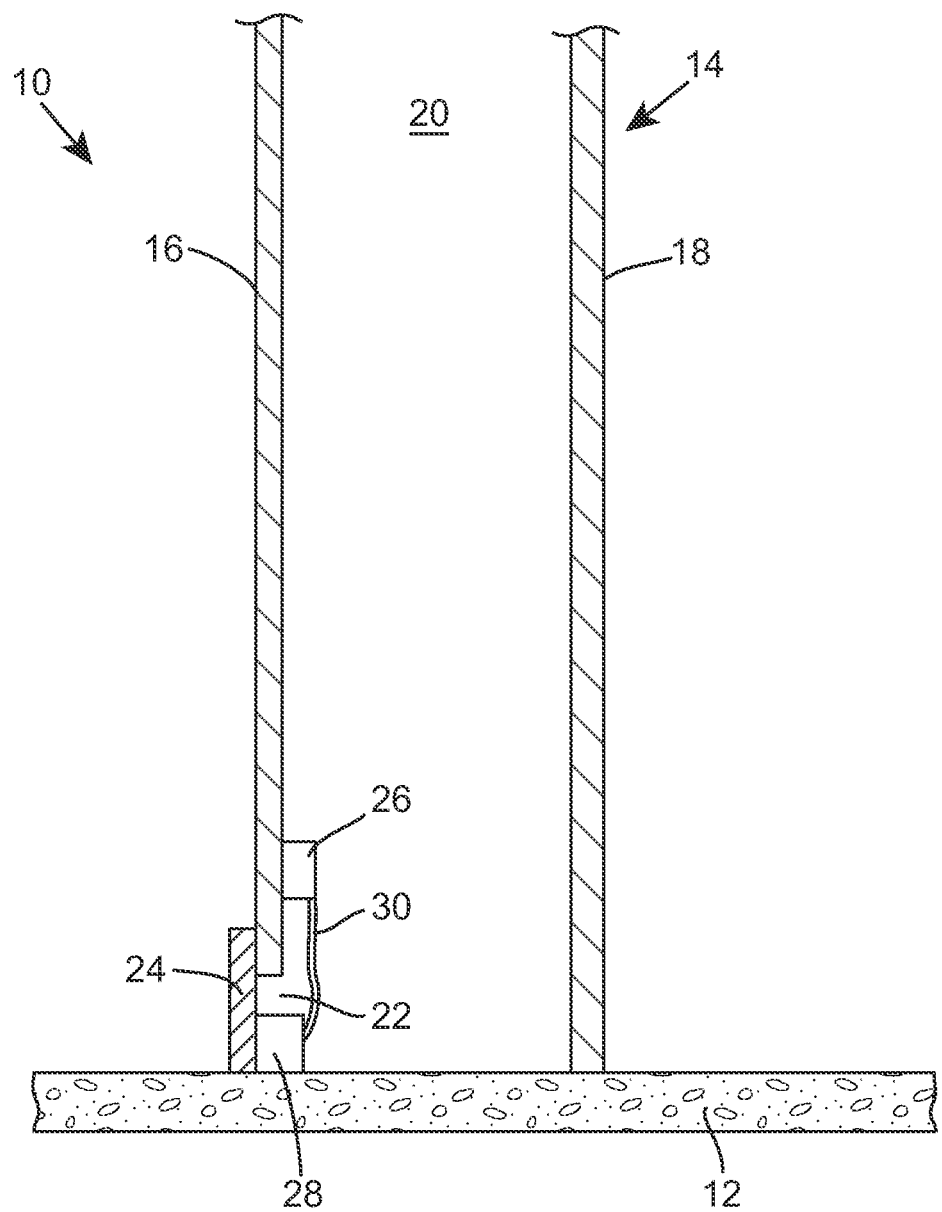
FIG. 1 shows a section view of a building structure according to an embodiment of the fourth aspect of the invention.
Figure 2:
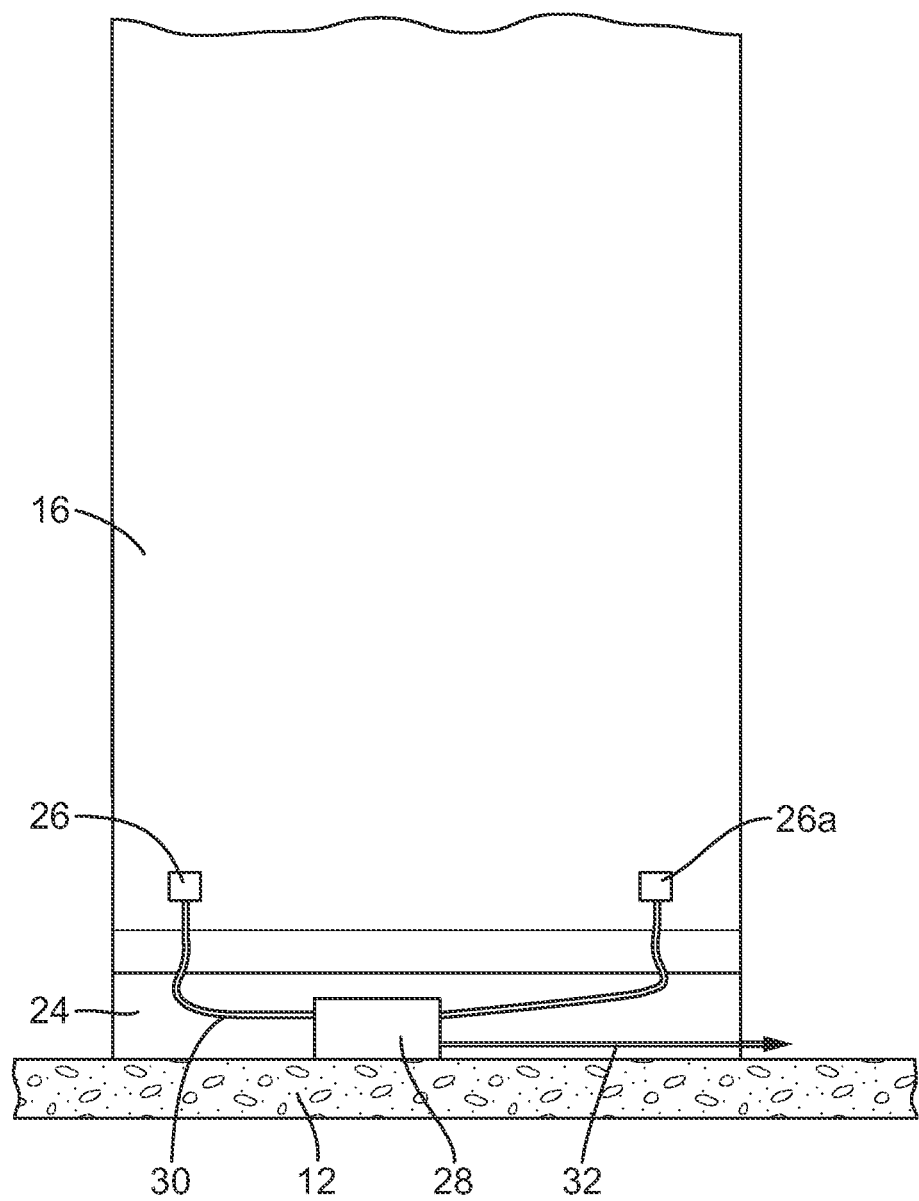
FIG. 2 shows a plan view of the building structure of FIG. 1.

FIG. 2 shows a plan view of the building structure shown in FIG. 1. The panel 16 is viewed from the interior of the wall 14 of FIG. 1. Like parts are numbered with like numerals.

The building structure 10 includes a floor 12 and a wall 14. The wall 14 includes two panels 16,18 bounding a cavity 20. The panels 16,18 may be e.g. gypsum panels having a paper lining at their surface. The panels are typically supported by a metal scaffold (not shown).

One of the panels 16 of the wall 14 does not contact the floor 12, thus leaving a gap 22 between the panel 16 and the floor 12. The gap is closed by an access board 24 located at an outer surface of the wall 14. By moving the access board 24, it is possible to gain access to the interior of the wall, that is, the cavity 20.

Sensors 26,26*a* are attached to the inner surface of the panel 16 (that is, the surface of the panel 16 that faces towards the cavity 20). The two sensors are piezoelectric transducers that are adapted to detect vibrations, e.g. acoustic waves, of the panel 16. That is, the two sensors are acoustic sensors.

The sensors 26,26*a* are located on the portion of the panel 16 adjacent to the gap 22. This allows easier access to the sensors e.g. for installation of the sensors or for maintenance purposes. In this embodiment, the sensors 26,26*a* are positioned symmetrically relative to a longitudinal symmetry axis of the panel 16.

Both sensors 26,26a are connected to control box 28 by means of conductive wiring 30. Signals from the sensors are relayed to the control box 28 by means of this conducting wiring 30.

The control box 28 determines the location of an impact on the panel 16, by comparing the acoustic signature of the impact (as detected by the sensors) to a pre-determined acoustic signature. The control box 28 is configured to use the Reversys™ technology developed by Sensitive Object and described in e.g, EP1512116.

The control box 28 includes a power supply and an electronic control system for controlling the operation of one or several apparatus such as a doorbell, a light source, a television, a radio, a sound system, a window blind, a ventilation system, or an alarm, as a function of the signals received from the sensors 26,26a. Further conductive wiring 32 connects the control box 28 to this apparatus (not shown).

In certain alternative embodiments, control box 28 may control the apparatus by means of electromagnetic radiation, e.g. radio waves, such as WiFi technology.

In certain alternative embodiments, the building structure may be configured such that control box 28 includes a photovoltaic power source, and the access board 24 is translucent or transparent, so as to allow light to reach the photovoltaic power source.

Figure 8:
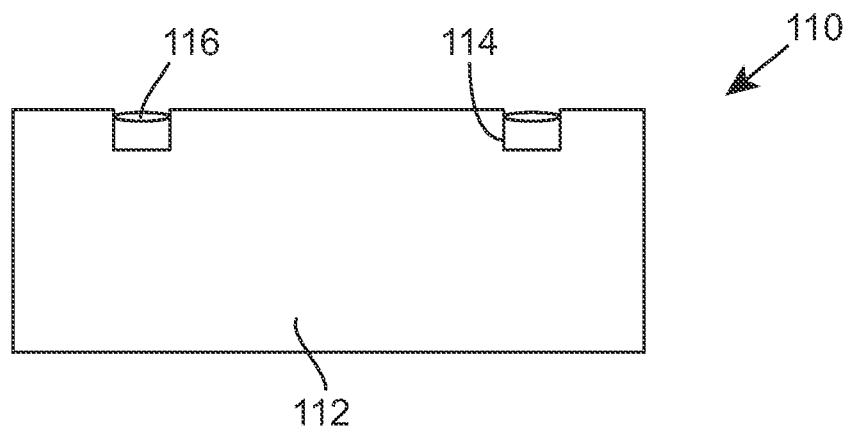
FIG. 8 shows a section view of the actuator of FIG. 7.

In certain alternative embodiments, the sensors 26,26a may be located in a recessed portion of the panel 16, e.g. such that the surface of the sensor is flush with the surface of the panel. This arrangement is shown in FIG. 8.

In certain alternative embodiments, the power for the electronic control system is provided by the mechanical vibrations of the panel, when this is pressed by the user.

Figure 3:
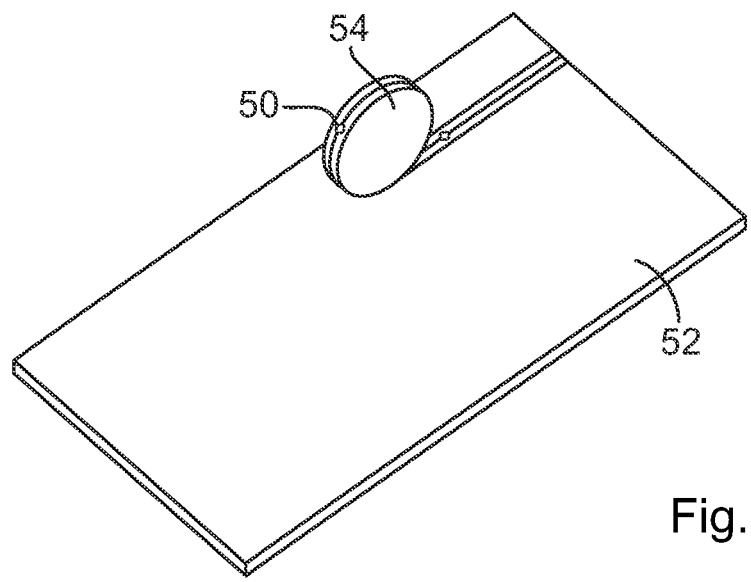
FIG. 3 shows a perspective view of an actuator according to a first embodiment of the first aspect of the invention, during manufacture of the actuator.

FIG. 3 shows a perspective view of an actuator according to a first embodiment of the first aspect of the invention, during manufacture of the actuator. Piezoelectric transducers 50 are attached to a panel 52 by means of adhesive tape 54.

Figure 4:
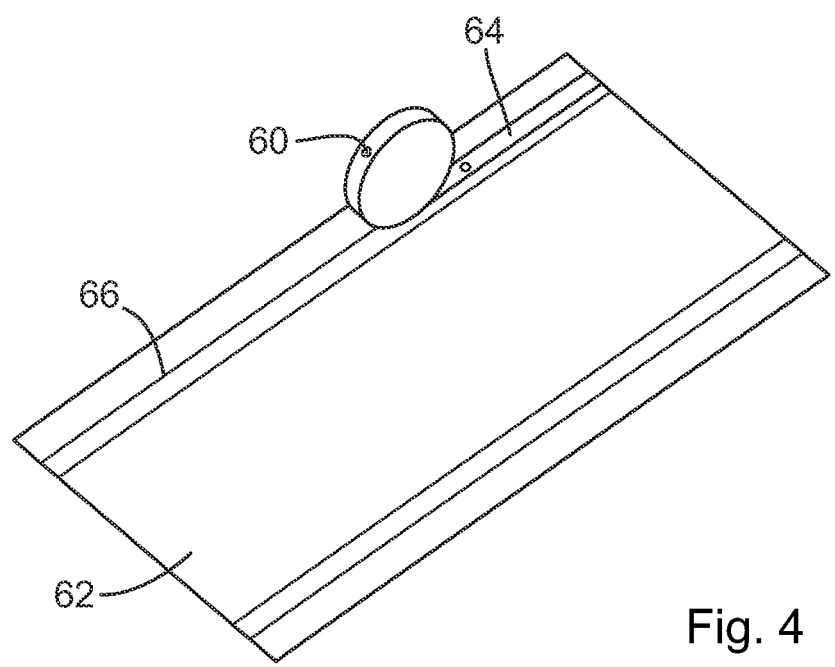
FIG. 4 illustrates a step in an example of a method of manufacture of an actuator according to a third aspect of the invention.

FIG. 4 illustrates a step in an example of a method of manufacture of an actuator according to a third aspect of the invention. A sheet of lining paper 62 has screen-printed electrically-conductive wires 66. Piezoelectric transducers 60 are applied to the sheet of lining paper 62 by means of adhesive tape 64, such that the transducers 60 contact the wires 66. Alternatively, the transducers may be attached to the lining paper by means of conductive glue. The wires 66 allow signals to be relayed from the piezoelectric transducers 60 to a control box (not shown).

Figure 5:
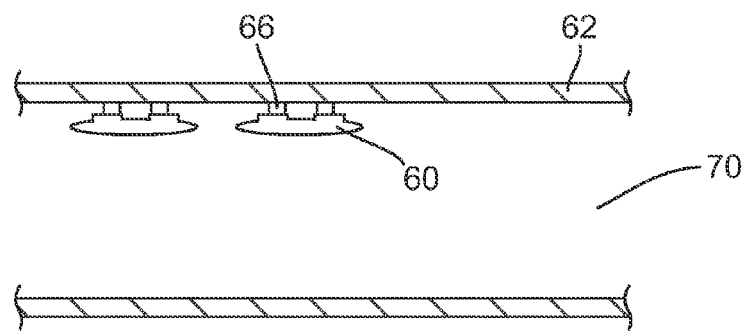
FIG. 5 shows a section view of an actuator according to a second embodiment of the first aspect of the invention, prepared according to an example of the method of manufacture of the third aspect of the invention.

FIG. 5 shows a section view of an actuator according to a second embodiment of the first aspect of the invention. A gypsum core 70 is lined with lining paper 62 as prepared in FIG. 4. Like numerals denote like features. The actuator of this embodiment is prepared by depositing gypsum slurry on the surface of the lining paper 62 to which the piezoelectric transducers 60 have been attached. Thus, once the gypsum slurry has set, a panel is provided in which the piezoelectric transducers 60 contact the gypsum core 70 and are hidden from view.

Figure 6:
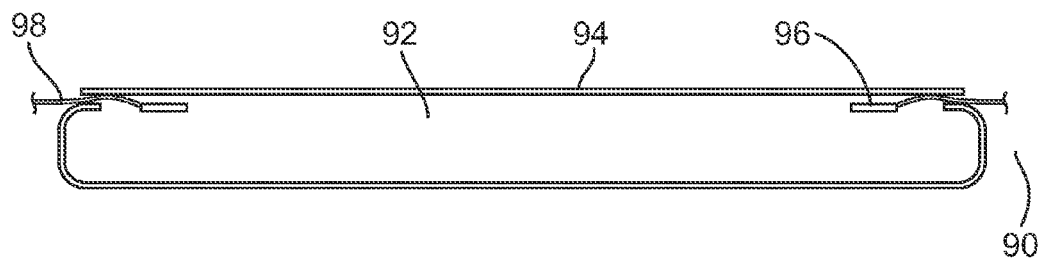
FIG. 6 shows a section view of an actuator according to a third embodiment of the first aspect of the invention.

FIG. 6 shows a section view of an actuator according to a third embodiment of the first aspect of the invention. Panel 90 comprises a gypsum core 92. The surfaces of the gypsum core 92 are covered with lining sheets 94. Piezoelectric transducers 96 are buried within the gypsum core 92. Wires 98 for connecting the transducers 96 to a control box (not shown) protrude from the panel.

The actuator of the third embodiment of the invention is produced by placing at least transducers 96 in a gypsum slurry before it has completely set to form a panel.

Figure 7:
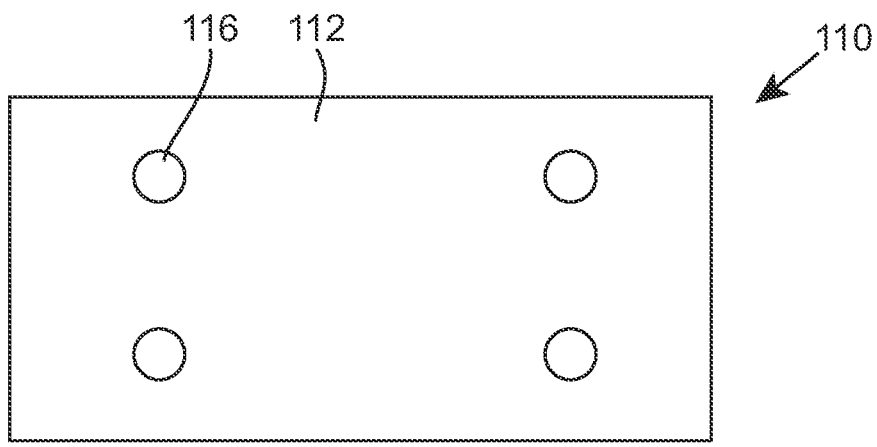
FIG. 7 shows a plan view of an actuator according to a fourth embodiment of the first aspect of the invention, prepared according to an example of the method of manufacture of the fifth aspect of the invention.

FIGS. 7 and 8 show views of an actuator according to a fourth embodiment of the first aspect of the invention. The actuator 110 comprises a panel 112. Recesses 114 are provided in one face of the panel 112. Acoustic sensors 116 (e.g. piezoelectric transducers) are positioned each within a respective recess 114. The outwardly-facing surface of each sensor 116 is flush with the face of the panel 112, that is, the sensors 116 do not protrude from the panel 112.

The invention claimed is:

1. An actuator for controlling the operation of an apparatus, the actuator comprising:
   (i) a panel for providing a partition within a building structure; and
   (ii) at least one acoustic sensor for detecting acoustic waves propagating through the panel, the acoustic sensor being adapted to emit signals for controlling the operation of the apparatus;
   wherein the panel is a gypsum wallboard; and
   the acoustic sensor is located within the panel.

2. An actuator according to claim 1, comprising at least two of the acoustic sensors.

3. An actuator according to claim 2, wherein the two acoustic sensors are positioned near one and the same edge of the panel.

4. An actuator according to claim 1, wherein the apparatus is any one of a doorbell, a light source, a television, a window blind, a radio, a sound system, a ventilation system and an alarm.

5. An actuator according to claim 1, wherein the panel has a recessed portion for accommodating the acoustic sensor, the acoustic sensor being accommodated in the recessed portion.

6. An actuator according to claim 1, wherein the acoustic sensor is entirely contained within the panel.

7. An actuator according to claim 1, wherein the acoustic sensor is glued to the panel.

8. An actuator according to claim 1, further comprising an electrically-conductive plate contained within the panel, the electrically-conductive plate providing a surface for electrical contact with conductive elements inserted through a face of the panel.

9. A method of manufacture of an actuator according to claim 1, comprising the steps of:
   attaching the acoustic sensor to a sheet; and
   forming the gypsum wallboard panel having the sheet as a liner, the acoustic sensor being located on an inwardly-facing surface of the sheet.

10. A method of manufacture according to claim 9, wherein the step of forming the panel comprises depositing a gypsum slurry on the surface of the sheet to which the acoustic sensor is attached.

11. A method of manufacture according to claim 9, in which the sheet has electrically-conductive paths and the acoustic sensor is attached to the sheet such that it is in electrical contact with the electrically-conductive paths.

12. A system for controlling the operation of an apparatus, the system comprising:
   an actuator comprising:
   (i) a panel for providing a partition within a building structure; and
   (ii) at least one acoustic sensor for detecting acoustic waves propagating through the panel, the acoustic sensor being adapted to emit signals for controlling the operation of the apparatus;
   and a controller for receiving signals from the acoustic sensor and communicating with the apparatus;

wherein the panel is a gypsum wallboard; and
the acoustic sensor is located within the panel.

13. A system according to claim 12, wherein the controller is configured to determine the location of an impact on the actuator.

14. A system according to claim 13, wherein the actuator has at least two of the acoustic sensors, and the controller is configured to determine the location of an impact on the actuator, by comparing the acoustic signature of the impact with at least one pre-determined acoustic signature.

15. A system according to claim 12, further comprising a power source for powering the controller.

16. A system according to claim 12, wherein the controller is adapted to be powered by mechanical vibrations of the panel.

17. A system according to claim 15, wherein the panel has a further recessed portion for accommodating the power source, the power source being accommodated in the further recessed portion.

18. A system according to claim 12, wherein the controller communicates with the apparatus using electromagnetic waves.

19. A building structure comprising:
a wall and a floor, the wall comprising an actuator, the actuator comprising:
  (i) a panel for providing a partition within a building structure; and
  (ii) at least one acoustic sensor for detecting acoustic waves propagating through the panel, the acoustic sensor being adapted to emit signals for controlling the operation of the apparatus;
and a power source, the power source being located within the wall;
wherein the panel is a gypsum wallboard; and
the acoustic sensor is located within the panel.

20. A building structure according to claim 19, further comprising an access board, the access board being removable to allow access to the power source from an outer surface of the wall.

21. A building structure according to claim 20, wherein the acoustic sensor is located on the portion of the panel proximate to the floor.

22. A building structure according to claim 21, wherein the access board is located adjacent to the floor.

23. A building structure according to claim 20, wherein the power source is a photovoltaic power source and the access board is translucent.

24. A method of manufacturing the actuator according to claim 1 wherein the method comprises the steps of:
providing the gypsum wallboard;
providing at least one recess in at least one face of the gypsum wallboard; and
positioning the acoustic sensor in the at least one recess.

* * * * *